PRINTED CIRCUIT FOR ARRAY OF TOROIDAL CORES
Filed Aug. 23, 1955
FIG. 1
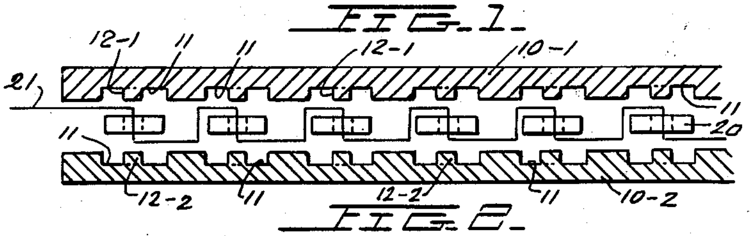
FIG. 2
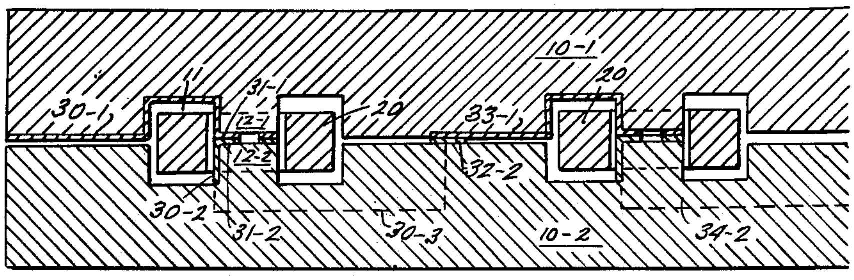
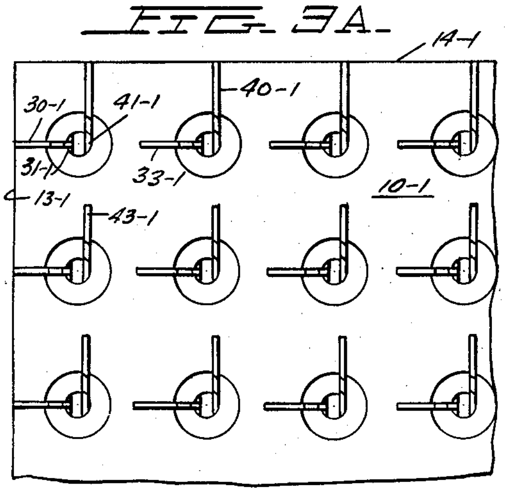
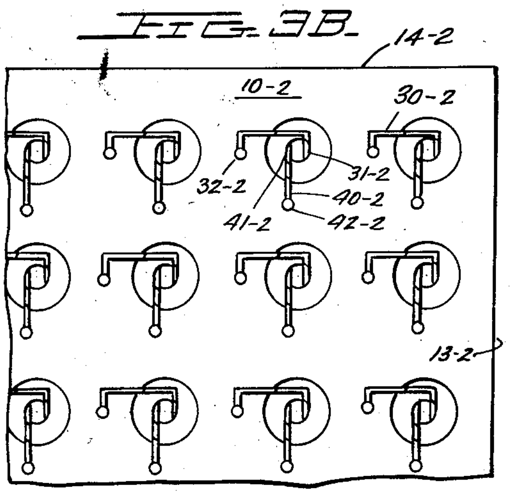
FIG. 4
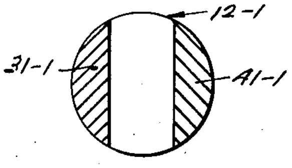
FIG. 5
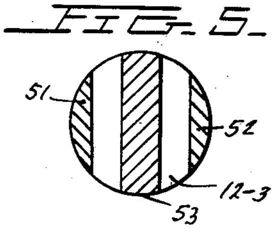
FIG. 6
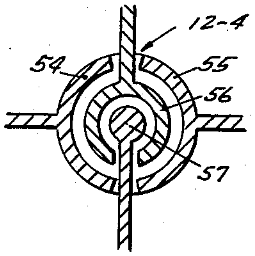
FIG. 7
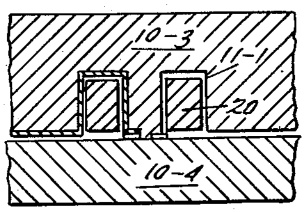
INVENTOR.
FREDERICK F. SYLVESTER
BY
Greene, Pineles & Durr
ATTORNEYS

United States Patent Office 2,901,736
Patented Aug. 25, 1959

2,901,736

PRINTED CIRCUIT FOR ARRAY OF TOROIDAL CORES

Frederick F. Sylvester, Short Hills, N.J., assignor to Steatite Research Corporation, Keasbey, N.J., a corporation of Delaware Application August 23, 1955, Serial No. 530,163

4 Claims. (Cl. 340—174)

This invention relates to a printed circuit type of device for assembling and electrically connecting an array of toroidal cores such as are required in a ferromagnetic type of memory system.

When ferromagnetic toroidal cores are employed in an array as a memory storage device in a computer mechanism, for example, a multiplicity (100 for example) of very small toroids are assembled by threading on a plurality of lateral and longitudinal conducting wires. For example 10 lateral and 10 longitudinal wires may be employed and 100 of the toroidal cores will be employed with one core at each intersection of a lateral conductor with a longitudinal conductor. Since the cores are very small it requires skilled operators to assemble such an array.

Among the objects of this invention is to provide a printed circuit type of support for ferromagnetic cores which provides the required longitudinal and lateral connections between the array of cores when said cores are positioned in the printed circuit support.

The objects of this invention are obtained by providing a printed circuit support for the toroidal cores in two complementary parts which when fitted together with the cores therebetween provides the desired electrical circuit connections for the cores. Since it is usually required that the lateral electrical connectors pass through the laterally aligned cores in the same direction, complementary parts of the electrical connectors are printed on the two parts of the support and these complementary circuit parts are completed when the two supporting parts are properly positioned together.

The printed circuit support elements may be formed of any desired non-conducting material, such as plastic materials including phenol formaldehyde condensation products, polyester resins, cellulose acetate, polyethylene, melamine resins, urea formaldehyde condensation products, etc., or ceramic insulating materials such as steatite, glass bonded mica, etc.

The conducting portions of the backing or support elements may be formed thereon by a printing process from silver containing ink or paste materials which are subsequently fired to produce a silver conductor or the process may include an electroplating step or any other known process for forming what are known as printed circuits may be employed. One method of making printed circuits (including an outline of three other methods) is disclosed in Modern Plastics for August 1951, p. 99 entitled, "Printed Circuits on Foil-Clad Plastics" by Robert L. Swiggett.

In the drawing:

Fig. 1 is an exploded view in cross section of the parts of the array of the invention.

Fig. 2 is an enlarged detail cross sectional view of the assembled device.

Figs. 3A and 3B are views of corresponding parts of the backing members.

Figs. 4, 5 and 6 are enlarged detailed views of alternative forms of the post contact portions of the backing members.

Fig. 7 is a view similar to Fig. 2 of a modified form of the device.

The device comprises the two parts of the backing 10–1 and 10–2 containing a plurality of ferromagnetic cores 20 therebetween. In Fig. 1 a wire 21 is shown passing through the cores 20. Such a wire is not required according to the present invention but the same effect is obtained by means of the printed circuit elements on the support members 10–1 and 10–2.

The support members 10–1 and 10–2 of Fig. 1 have a plurality of depressions 11 formed therein into which the cores 20 are adapted to fit. According to Fig. 1 the support members 10–1 and 10–2 are substantially identical, the depressions 11 being of substantially equal depth on both members, but the entire depression can be on one member or may be divided unequally between the members. The central portion of each depression 11 includes a post 12–1 or 12–2, the top surface of which is even with the top surface of the remainder of the member so that when the two members 10–1 and 10–2 are held together in proper position each post 12–1 on member 10–1 will contact a corresponding post 12–2 on member 10–2.

The effect of the conductor wire 21 passing through the cores 20 is obtained by the printing of the conducting lines 30–1, 30–2, 31–1 and 31–2, etc. on the members 10–1 and 10–2. As shown in Fig. 2, a conductor line 30–1 extends from one side of plate 10–1 to the edge of the depression 11 and continues down into the depression 11 and up on post 12–1, terminating in a region 31–1 at the top of the post 12–1. The region 31–1 contacts region 31–2 on the corresponding post 12–2. Line 31–2 is continuous with line 30–2 on member 10–2. Line 30–2 passes in and out of depression 11 of member 10–2 finally terminating in region 32–2. All of the line 30–2 cannot be traced in Fig. 2 but dotted lines 30–3 indicate the effect obtained.

Figs. 3A and 3B shows two plates 10–1 and 10–2 opened up to show backing plates for an array connected laterally and vertically. In these figures edge 13–1 of plate 10–1 is to coincide with edge 13–2 of plate 10–2 and edge 14–1 is to coincide with edge 14–2. When these plates are held together line 30–1 connects through region 31–1 to region 31–2 of plate 10–2 which in turn connects at 32–2 to line 33–1 of plate 10–1 and so on across the assembly. Likewise vertical line 40–1 connects at region 41–1 of post 12–1 to region 41–2 of post 12–2 and this region 41–2 connects to line 40–2 leading to region 42–2 which connects to the region 43–1 of plate 10–1 etc. down through the vertical line of cores.

Fig. 4 shows an enlarged detail view of a post 12–1 containing two electrical connecting regions 31–1 and 41–1. Fig. 5 shows a modified form of the device in which the post 12–3 contains three separate conducting regions 51, 52 and 53. Fig. 6 shows another modified form of post 12–4 which contains four separate connecting regions 54, 55, 56 and 57. It will be understood that where posts like those shown in Figs. 5 and 6 are formed the corresponding posts on the complementary plates will have substantial duplicates or mirror images of the said connecting regions.

Fig. 7 shows two backing or supporting plates 10–3 and 10–4 in which plate 10–4 is substantially planar and the entire depression 11–1 for the cores 20 is formed in plate 10–3.

The features and principles underlying the invention described above in connection with specific exemplifications will suggest to those skilled in the art many other modifications thereof. It is accordingly desired that the appended claims shall not be limited to any specific feature or details thereof.

I claim:

1. In a memory core system, a pair of complementary supporting plates for holding a multiplicity of toroidal cores therebetween, at least one of said plates having a multiplicity of aligned depressions therein into which said cores are adapted to fit, said depressions containing a post in the central portion thereof adapted to extend through the opening in the toroid, a toroidal core fitted into each of said depressions, said supporting plates being formed of insulating material, said plate with said depressions containing a plurality of spaced, line portions of conductive material each extending into one of said depressions and ending on the post of its depression, the other of said plates containing a plurality of spaced, line portions of conductive material which are complementary to the line portions of the first plate which when the plates are pressed together form at least one continuous line of conducting material passing through a plurality of aligned cores.

2. In a memory core system as claimed in claim 1, said pair of supporting plates being substantially identical in that each of said plates has corresponding aligned depressions therein to hold said toroids.

3. In a memory core system as claimed in claim 1, in which only one of said plates has depressions therein for holding said toroids.

4. In a process of making a memory core matrix the steps comprising providing a pair of insulating plates, a first of said plates having a multiplicity of depressions provided with a central post therein adapted to hold a corresponding multiplicity of ferromagnetic toroids with the post extending through the opening in the toroid, printing a multiplicity of unconnected liens of conducting material extending from one side of the depressions down into, and across the depressions and up onto the post on said first plate, printing a corresponding multiplicity of unconnected conducting lines on the second of said pair of plates, said conducting lines of said second plate being adapted to connect certain of the unconnected lines of the first plate together when the plates are sandwiched together, inserting a multiplicity of ferromagnetic toroids in the said depressions and holding said plates together to provide said matrix.

References Cited in the file of this patent

UNITED STATES PATENTS

| | | |
|---|---|---|
| 2,651,833 | Kernahan | Sept. 15, 1953 |
| 2,700,150 | Wales | Jan. 18, 1955 |
| 2,716,268 | Steigerwalt | Aug. 31, 1955 |
| 2,752,537 | Wolfe | June 26, 1956 |
| 2,783,416 | Butler | Feb. 26, 1957 |
| 2,784,391 | Rajchman et al. | Mar. 5, 1957 |